United States Patent [19]
Tsuyuki et al.

[11] Patent Number: 5,883,386
[45] Date of Patent: Mar. 16, 1999

[54] LIGHT-RECEIVING APPARATUS HAVING A POSITION DETECTABLE PORTION ON A SEALING FRAME AND ITS MANUFACTURING METHOD

[75] Inventors: Hiroto Tsuyuki; Hironobu Amemiya; Tomoki Nakamura, all of Yotsukaido, Japan

[73] Assignee: Seiko Precision Inc., Japan

[21] Appl. No.: 929,906

[22] Filed: Sep. 16, 1997

[30]      Foreign Application Priority Data

Sep. 17, 1996  [JP]  Japan .................................. 8-244621

[51] Int. Cl.$^6$ ........................................................ H01J 5/02
[52] U.S. Cl. ............................................ 250/239; 257/433
[58] Field of Search ............................... 250/239, 214.1; 257/81–84, 433, 434, 435

[56]             References Cited

U.S. PATENT DOCUMENTS 5,783,815   7/1998   Ikeda ....................................... 250/239

*Primary Examiner*—Que T. Le
*Attorney, Agent, or Firm*—Adams & Wilks

[57]             ABSTRACT

A light-receiving apparatus comprises a light-receiving device positioned relative to an external component with increased accuracy. A sealing frame is mounted on a printed circuit board. One corner of this sealing frame is detectable by image processing. The position inside of the sealing frame at which the light-receiving device should be mounted is determined from the detected position of the corner of the sealing frame. A sealing material is injected inside the sealing frame and cured, thereby sealing the light-receiving device. Pins of the external components are inserted into holes or cutouts in the sealing frame and made stationary when the light-receiving device is mounted to the external component. The mounting of the light-receiving device inside the sealing frame is based on the sealing frame, and the mounting of the apparatus to the external part is based on the sealing frame. Therefore, the light-receiving device can be mounted relative to the external part with high accuracy.

11 Claims, 4 Drawing Sheets

LIGHT-RECEIVING APPARATUS HAVING A POSITION DETECTABLE PORTION ON A SEALING FRAME AND ITS MANUFACTURING METHOD

BACKGROUND OF THE INVENTION

1. Field of the Invention

The present invention relates to a light-receiving apparatus for use in a camera or the like and, more particularly, to a light-receiving apparatus for determining the range or distance to a subject to be photographed and to a method of fabricating such a light-receiving apparatus.

2. Description of the Related Art

The configuration of a prior art light-receiving apparatus for a camera or the like is shown in FIG. 4, where a light-receiving device 12 is monolithically integrated with an arithmetical IC on a printed circuit board 11. A sealing frame 13 is mounted around the light-receiving device 12. A sealing material 14 is injected and cured inside the sealing frame 13, thereby sealing the light-receiving device 12. Mounting means, such as holes 16a and 16b, are formed in the printed circuit board 11 to position and mount the apparatus to a structural component, such as a camera holder.

The prior art light-receiving apparatus shown in FIG. 4 is fabricated in the manner described below. A die pad 11a is formed as a part of a conductor pattern on the printed circuit board 11. The position of the die pad 11a is detected by image recognition techniques. The light-receiving device 12 is mounted on the die pad 11a, and the sealing frame 13 is mounted around the light-receiving device 12. The sealing material 14 is injected and cured inside the sealing frame 13. When the apparatus is mounted to a structural component, such as a camera holder, pins of the holder are inserted into the holes 16a and 16b of the printed circuit board 11. The pins are then placed in position and adjustments are made. The pins are fixed using an adhesive or the like. The order in which the sealing frame 13 and the light-receiving device 12 are mounted may be reversed. The sealing frame 13 suffices to surround the light-receiving device 12. Higher positioning accuracy is not required.

The mounting means 16a and 16b formed in the printed circuit board 11 are used to assist in positioning the light-receiving apparatus relative to the structural component. The position of the light-receiving device 12 is determined based on the position of the die pad 11a that is printed as a part of the conductor pattern.

Japanese Patent Examined Publication No. 44283/1995 discloses a technique for forming a leadframe by insert molding to fabricate a sealing frame integrally with a support plate for the leadframe. Also in this technique, mounting means is formed in the support plate for positioning the light-receiving apparatus relative to a structural component, such as a camera holder, and for mounting the light-receiving apparatus to the structural component. A light-receiving device is mounted at a position determined based on the position of the leadframe.

In the conventional light-receiving apparatus, the accuracy of range finding is determined by the portion of the light-receiving device 12 (generally, a position-sensitive detector (PSD)) that receives light transmitted through optics. In particular, the light-receiving apparatus is so set up that the illuminated position on the position-sensitive detector (PSD) is varied according to the distance to the subject. An IC calculates the distance to the subject dependent on the illuminated position on the PSD. During this range-finding operation, in order that the illuminated position be located accurately, it is necessary that the optic axis of a lens fixedly mounted to the holder accurately pass across a given position on the light-receiving device 12. Although the positional relationship between the printed circuit board 11 and the holder is not very important, the positional relationship between the light-receiving device 12 and the holder greatly affects the accuracy of the range finding. Therefore, it is necessary to accurately position the light-receiving device 12 relative to the holder.

In any of the prior art techniques described above, the light-receiving device 12 is not accurately positioned relative to the holder, thereby resulting in the danger that the light-receiving apparatus may become defective. In the first-mentioned conventional technique, the light-receiving device 12 is mounted according to the conductor pattern printed or otherwise formed on the printed circuit board 11. The pins are inserted into the holes 16a and 16b formed in the printed circuit board, and the holder is mounted. However, a slight mismatch tends to take place between the formation of the conductor pattern on the printed circuit board 11 and the stamping operation defining the contour including the holes 16a and 16b. This may result in an error in the positional relationship between the conductor pattern and the holes 16a, 16b. Consequently, the positional relationship between the light-receiving device 12 and the holder may be upset.

Where insert molding is done, the light-receiving device 12 is mounted at a position determined based on the position of the leadframe. Protrusions formed on the support plate are fitted in holes and thus the holder is mounted. If the accuracy of the relative positional relationship among various components during insert molding, especially the positional relationship between the support plate and the leadframe, is not good, the relative positional accuracy between the light-receiving device and the holder is low. Furthermore, these process steps are cumbersome to perform, because insert molding must be performed with high accuracy.

Accordingly, by the foregoing prior art techniques, there is the possibility that the relative positional relationship between the light-receiving device and the holder deteriorates. Therefore, slight play is provided around the holder-mounting-and-guiding means formed by the mounting means 16a, 16b in the printed circuit board 11. The positioning operation is required to be carried out using other positioning mechanisms, such as eccentric pins, while adjusting the position and the angular position of the board 11, the holder, or the lens in order to accomplish an accurate positioning operation. In this manner, the use of other positioning mechanisms or complex fabrication steps are necessary to position the light-receiving device 12 relative to the holder accurately.

SUMMARY OF THE INVENTION

The present invention overcomes the foregoing problems in the conventional art.

It is an object of the present invention to provide a light-receiving apparatus which is used to obtain range or distance measurements and which can be readily positioned relative to an external structural component with increased accuracy.

Another object of the present invention is to provide a light-receiving apparatus which is simple and economical to manufacture.

The foregoing and other objects of the present invention are achieved by a light-receiving apparatus comprising a printed circuit board, a sealing frame mounted on the printed circuit board, a light-receiving device mounted in the sealing frame, a sealing material disposed in the sealing frame for sealing the light-receiving device, and mounting means for mounting the light-receiving device to an external structural component. The sealing frame has a marked portion whose position can be recognized or detected by image recognition and used to locate the position of the light-receiving device within the sealing frame. By this construction, the light-receiving device and the external structural component are accurately positioned by a common member, i.e., the sealing frame. A position of the marked portion of the sealing frame is detected by image recognition, and the light-receiving device is mounted in the sealing frame at a position determined from the detected position of the marked portion. The light-receiving device is accurately positioned with respect to the external structural component simply by mounting it to the external structural component using the mounting means.

Preferably, the sealing frame is provided with a recess defining an adhesive reservoir, and the sealing frame is bonded to the printed circuit board via an adhesive contained in the reservoir.

In another aspect, the present invention is directed to a method of fabricating a light-receiving apparatus comprising the steps of preparing a sealing frame having mounting means used for positioning and a marked portion that can be recognized by image processing, mounting the sealing frame on a printed circuit board, detecting the position of the marked portion of the sealing frame by image processing, locating a position within the sealing frame at which a light-receiving device should be placed according to the detected position of the marked portion of the sealing frame, mounting a light-receiving device at the located position, injecting a sealing material inside the sealing frame, curing the sealing material, and mounting the light-receiving device to an external structural component via the mounting means of the sealing frame.

Other objects and features of the present invention will appear in the course of the following detailed description of a preferred embodiment of the invention.

DETAILED DESCRIPTION OF THE PREFERRED EMBODIMENTS

An embodiment of a light-receiving apparatus according to the present invention and its manufacturing method is described below with a particular application to a light-receiving apparatus for determining the range or distance from a camera to a subject to be photographed. However, it is understood by those of ordinary skill in the art that the light-receiving apparatus and its manufacturing method according to the present invention are suitable for other applications.

Figure 1:
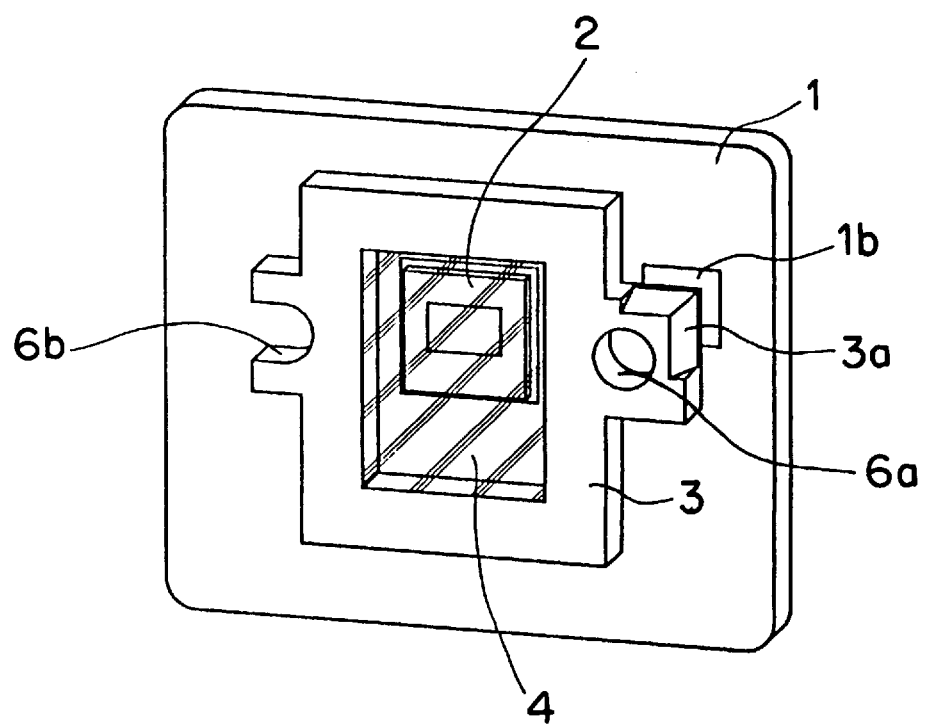
FIG. 1 is a perspective view of a light-receiving apparatus according to an embodiment of the present invention.
Figure 2:
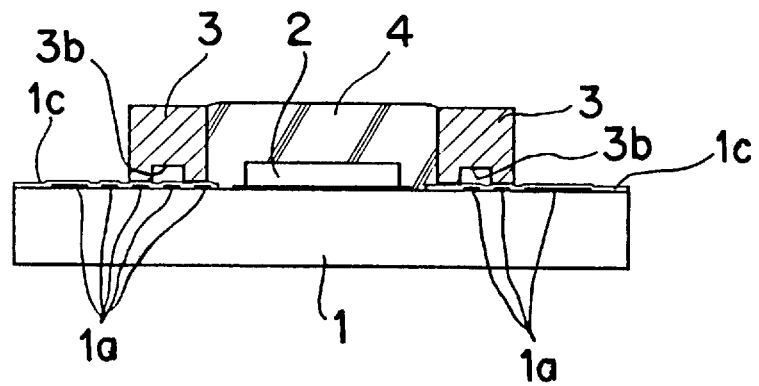
FIG. 2 is a plan view in cross-section of the light-receiving apparatus shown in FIG. 1.
Figure 3:
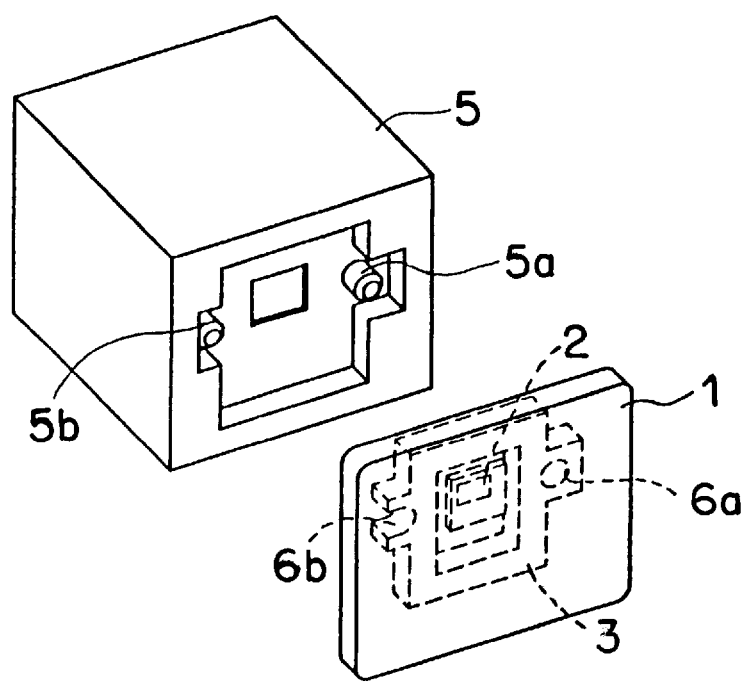
FIG. 3 is an exploded perspective view illustrating the manner in which the light-receiving apparatus shown in FIGS. 1 and 2 is mounted to an external structural component.
Figure 4:
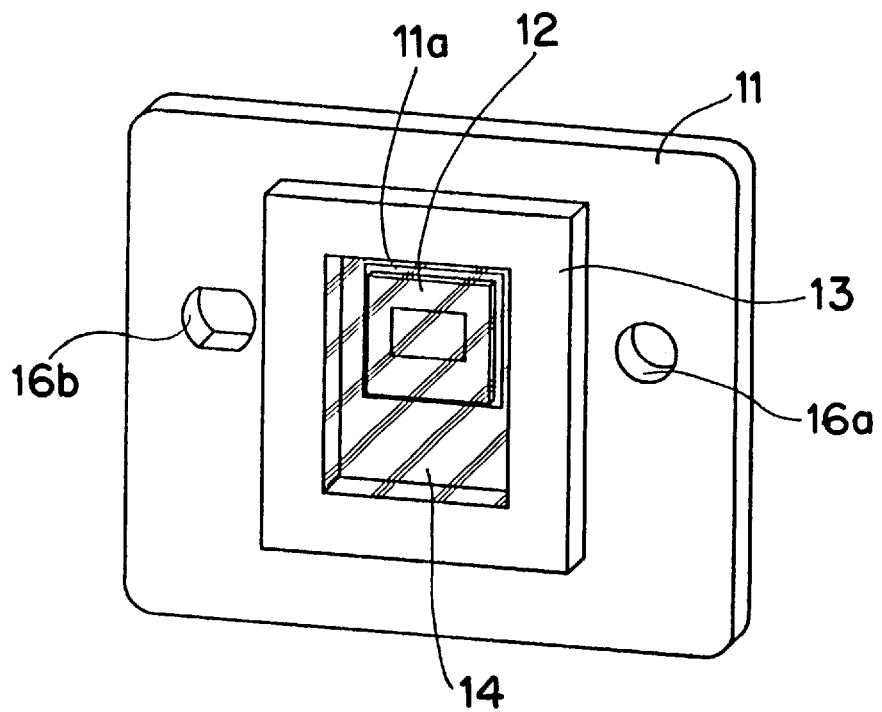
FIG. 4 is a perspective view of a prior art light-receiving apparatus.

As shown in FIGS. 1–3, the light-receiving device according to an embodiment of the present invention comprises a printed circuit board 1 having a main surface 1a provided with a conductor pattern 1b, a sealing frame 3 mounted over the main surface 1a of the printed circuit board 1 through a solder resist 1c, a light-receiving device 2 mounted in the sealing frame 3, a sealing material 4 disposed in the sealing frame 3 for sealing the light-receiving device 2 to the main surface 1a of the printed circuit board 1, and mounting means 6a, 6b for mounting the light-receiving device 2 to an external structural component 5 (FIG. 3).

The sealing frame 3 has a body portion 3a, a hole 3b extending through the body portion 3a, a recess 3c formed along side edges 3d, a first arm portion 3e extending outwardly from a side surface 3f, and a second arm portion 3g extending outwardly from a side surface 3h opposite the side surface 3f. The body 3a, the first arm portion 3f and the second arm portion 3g of the sealing frame 3 are preferably formed in one piece by a suitable molding process. The recess 3c defines an adhesive reservoir for storing an adhesive for bonding the sealing frame 3 to the main surface 1a of the printed circuit board 1. The light-receiving device 2 is disposed in the hole 3b of the sealing frame 3, and the sealing material 4, such as an infrared radiation-transmitting resin, is disposed in the hole 3b and completely surrounds the light-receiving device 2 to securely seal the light-receiving device 2 in the hole 3b of the sealing frame 3. As shown in FIG. 1, when the sealing frame 3 is bonded to the main surface 1a of the printed circuit board 1, a corner portion 3i of the first arm portion 3f of the sealing frame 3 partially covers an auxiliary pattern 1d which may be part of, and formed simultaneously with, the conductor pattern 1b disposed on the main surface 1a of the printed circuit board 1.

The mounting means comprises a hole 6a formed in the first arm portion 3f of the sealing frame 3, and a cutout 6b formed in the second arm portion 3g of the sealing frame 3. As further described below, the light-receiving device 2 is subsequently positioned and mounted to an external structural component 5 (FIG. 3), such as a camera holder, by means of the hole 6a and the cutout 6b.

Preferably, the light-receiving device 2 is a position-sensitive detector (PSD) comprised of a chip integrated with an arithmetical IC, and the sealing material 4 is an infrared radiation-transmitting resin. However, it is understood by those of ordinary skill in the art that other types of light-receiving devices and sealing materials are suitable.

A method of fabricating the light-receiving apparatus according to the present invention is next described. First, the conductor pattern 1b is formed on the main surface of the printed circuit board 1 together with the auxiliary pattern 1d. A layer of the solder resist 1c is then applied to the portion of the main surface 1a of the printed circuit board 1 that is to be bonded to the sealing frame 3. If the thickness of the conductor pattern 1b creates unevenness on the main surface 1a of the printed circuit board 1, the solder resist 1c flattens the main surface 1a and prevents surrounding patterns (such as a die pad and a COB pad) from being contaminated. Furthermore, the solder resist 1c smoothens the edges of the conductor pattern 1b. This prevents the adhesive in the recess 3d of the sealing frame 3, which is used for bonding the sealing frame 3 to the printed circuit board 1, from flowing out along the edges of the conductor pattern 1b on the bonded surface of the sealing frame 3 due to capillary action. By this construction, the amount of the adhesive is made uniform, which in turn enhances the hermeticity of the bonded surface of the sealing frame 3.

Thereafter, the sealing frame 3 is bonded to the main surface 1a of the printed circuit board 1 through the solder resist 1c by means of a suitable adhesive disposed in the recess 3c of the sealing frame 3. The sealing frame 3 is positioned over the main surface 1a of the printed circuit board 1 so that the corner portion 3i of the first arm portion 3e partially covers the auxiliary pattern 1d.

The corner portion 3i of the sealing frame 3 defines a marked portion recognized by image processing. In the present embodiment, the contrast between the pattern 1d and the sealing frame 3 is high because the corner portion 3i of the sealing frame 3 is located on the auxiliary pattern 1d. This assures the execution of the image processing for detecting the position of the corner portion 3i of the sealing frame. Alternatively, the position of the portion of the auxiliary pattern 1d covered with the sealing frame 3 and the position of the portion not covered may be separately recognized to thereby recognize the position of the corner portion 3i of the sealing frame 3.

If the position of the corner portion 3i of the sealing frame 3 is recognized in this way, the position and the posture of the whole sealing frame 3 can be found because the shape and the size of the sealing frame 3 are already known. A desired installation position in the hole 3b of the sealing frame 3 is determined according to the position and posture of the whole sealing frame 3. The light-receiving device 2 is then installed at this desired position. At this point, the light-receiving device 2 is accurately positioned relative to the sealing frame 3 and the printed circuit board 1. Thereafter, the sealing material 4 is injected in the hole 3b of the sealing frame 3 and cured to thereby effectively seal the light-receiving device at the desired position in the hole 3b of the sealing frame 3.

As shown in FIG. 3, the light-receiving device 2 is then mounted to the holder 5 by inserting pins 5a and 5b of the holder 5 into the round hole 6a and the cutout 6b, respectively, formed in the first arm portion 3e and the second arm portion 3g, respectively, of the sealing frame 3. After the pins 5a, 5b are placed in position, the pins are fixed with a suitable adhesive.

A method of, for example, measuring a distance to a subject to be photographed using the light-receiving apparatus according to the present invention is now described briefly. Optics (not shown) are built on the holder 5 and on other elements and include a light-projecting means that projects infrared light toward a subject. Light reflected from the subject passes through a lens and impinges on the light-receiving device 2, such as a position-sensitive detector (PSD). The output from the PSD varies according to the distance between the impinging point and the central point. The impinging point can be found by analyzing the output from the light-receiving device 2. Moreover, the distance to the subject can be found by trigonometrical calculation in a manner well known and therefore not illustrated.

In accordance with the present invention, the position at which the light-receiving device 2 should be installed is determined according to the position of the sealing frame 3 found by image recognition. The light-receiving device 2 is installed at this position. The light-receiving device 2 is then mounted to the holder 5 via the mounting means 6a and 6b in the sealing frame 3. That is, both the light-receiving device 2 and the holder 5 can be mounted according to the position of the sealing frame 3. Hence, the light-receiving device 2 can be mounted relative to the holder 5 accurately, or with an error of about fA 0.05 mm. This enables the light-receiving device 2 to be mounted accurately relative to the optic axis of the lens (not shown) mounted to the holder 5. Since the calculation of the distance is based on the position within the light-receiving device 2 at which reflected light transmitted through the lens is received as mentioned above, the accuracy of the range finding can be enhanced if the light-receiving device is mounted accurately with respect to the optic axis of the lens. The present invention yields this advantage without needing any extra positioning mechanism or positioning operation, unlike the prior art technique producing an error of approximately fA 0.3 mm.

In the case of the prior art technique utilizing insert molding, the support plate is integrated with the sealing frame, but the accuracy of the relative position between the resin and the leadframe poses problems during the insert molding. In the present invention, since the position of the sealing frame 3 can be calculated and maintained, the accuracy of the relative positional relationship between the light-receiving device 2 and an external structural component, such as the holder 5, is enhanced. High accuracy is further obtained by fabrication steps much simpler than the prior art technique using insert molding.

In the embodiment described above, the corner portion 3i of the sealing frame 3 is recognized by image processing. Alternatively, holes or recesses may be previously formed as marked portions in the sealing frame 3. The position of the sealing frame 3 may be detected by recognizing these holes or recesses by image recognition techniques. In this case, the auxiliary pattern 1d on the printed circuit board 1 is not necessary, but these holes or recesses in the sealing frame 3 need to be formed with high positional accuracy.

Although in the present embodiment the light-receiving apparatus is mounted to a holder 5 for a photographic camera, it is understood that the present invention is not limited to such embodiment. Rather, the present invention can find a broad spectrum of applications in which the light-receiving device 2 is required to be positioned relative to other types of external structural components with increased accuracy.

Moreover, the positioning and mounting means in the sealing frame 3 are not limited to the round hole 6a and/or the cutout 6b. For instance, the mounting means may be pin-like members formed in the sealing frame 3 for insertion into holes in the external structural component.

In accordance with the present invention, the positions at which the light-receiving device and the external component are mounted are determined according to the position of the sealing frame. This improves the accuracy of the relative position between the light-receiving device and the external structural component. Where the sealing frame is bonded to the printed circuit board with an adhesive stored in an adhesive reservoir formed in the sealing frame, the hermeticity of the bonded surface of the sealing frame is enhanced. This construction further assures that the sealing material is stored in the sealing frame.

We claim:

1. A light-receiving apparatus comprising:
   a printed circuit board;
   a sealing frame mounted on the printed circuit board;
   a light-receiving device disposed in the sealing frame, the sealing frame having a portion capable of being recognized by image recognition for detecting the position of the light-receiving device in the sealing frame;
   a sealing material disposed in the sealing frame for sealing the light-receiving device; and
   mounting means disposed on the sealing frame for mounting the light-receiving device to an external component.

2. A light-receiving apparatus according to claim 1; wherein the sealing frame has an adhesive reservoir for storing an adhesive, the sealing frame being bonded to the printed circuit board with the adhesive.

3. A light-receiving apparatus according to claim 2; wherein the adhesive reservoir comprises a recess formed in a surface of the sealing frame.

4. A light-receiving apparatus according to claim 1; wherein the sealing frame has a first arm portion extending outwardly from a first side surface thereof and a second arm portion extending outwardly from a second side surface thereof opposite the first surface; and wherein the mounting means comprises a hole formed in the first arm portion of the sealing frame and a cut-out formed in the second arm portion of the sealing frame.

5. A light-receiving apparatus according to claim 1; wherein the sealing frame has a body portion and a hole extending through the body portion for receiving the light-receiving device and the sealing material for sealing the light-receiving device.

6. A light-receiving apparatus according to claim 1; wherein the sealing frame has a plurality of side edges and a recess formed along the side edges for storing an adhesive, the sealing frame being bonded to the printed circuit board with the adhesive.

7. A light-receiving apparatus according to claim 4; wherein the printed circuit board has a main surface provided with a conductor pattern, and the first arm portion of the sealing frame has a corner portion partially covering a portion of the conductor pattern of the printed circuit board.

8. A method of fabricating a light-receiving apparatus, comprising the steps of:

preparing a sealing frame having a marked portion capable of being recognized by image processing;

mounting the sealing frame on a printed circuit board;

detecting a position of the marked portion by image recognition;

locating a position in the sealing frame at which a light-receiving device is to be installed according to the detected position of the marked portion;

installing a light-receiving device at the located position in the sealing frame;

injecting a sealing material in the sealing frame and curing the sealing material to seal the light-receiving device; and mounting the light-receiving device to an external structural component via mounting means disposed in the sealing frame.

9. A method of fabricating a light-receiving apparatus comprising the steps of:

preparing a sealing frame having an adhesive reservoir containing an adhesive, and a marked portion capable of being recognized by image processing;

bonding the sealing frame to a main surface of a printed circuit board with the adhesive;

detecting a position of the marked portion of the sealing frame by image recognition;

locating a position in the sealing frame at which a light-receiving device is to be installed according to the detected position of the marked portion;

installing a light-receiving device at the located position in the sealing frame;

injecting a sealing material in the sealing frame and curing the sealing material to seal the light-receiving device; and counting the light-receiving device to an external structural component via mounting means disposed in the sealing frame.

10. A method according to claim 9; wherein the main surface of the printed circuit board has a conductor pattern, the bonding step including partially covering a portion of the conductor pattern of the printed circuit board with a corner portion of the sealing frame.

11. A method according to claim 9; wherein the preparing step includes preparing the sealing frame having the adhesive reservoir formed in a surface of the sealing frame.

* * * * *